Figure 1:
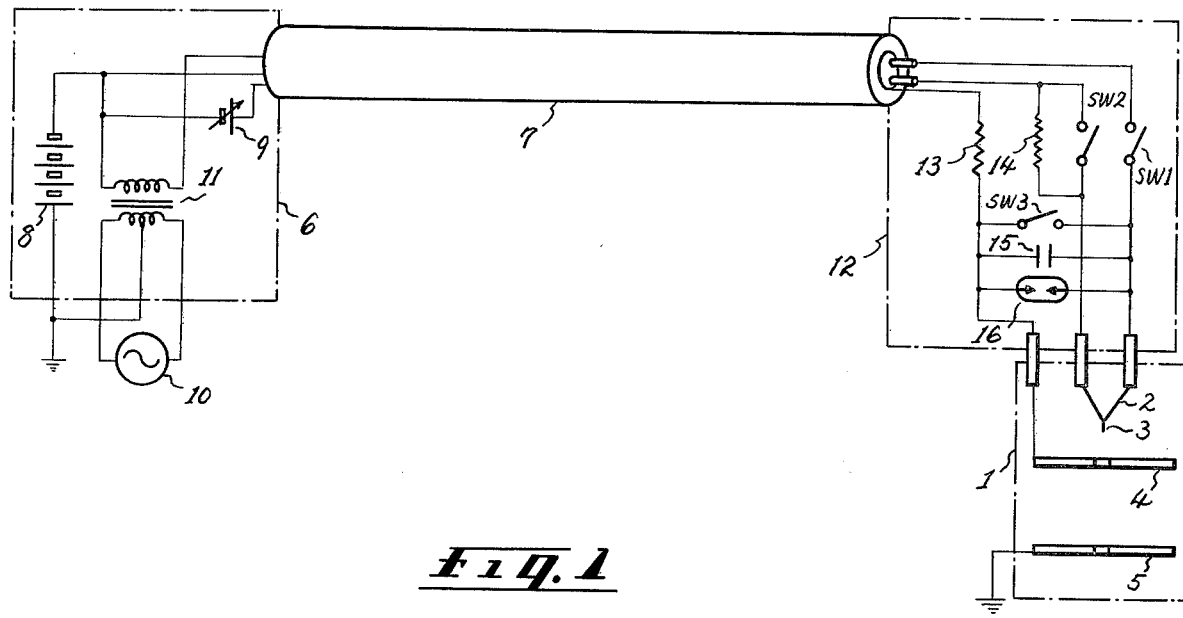

United States Patent [19]
Ota et al.

[11] 3,938,001
[45] Feb. 10, 1976

[54] PROTECTION CIRCUIT FOR ELECTRON GUN

[75] Inventors: Susumu Ota; Ryuzo Aihara, both of Akishima, Japan

[73] Assignee: Nihon Denshi Kabushiki Kaisha, Tokyo, Japan

[22] Filed: Feb. 26, 1974

[21] Appl. No.: 445,955

[30] Foreign Application Priority Data
Mar. 3, 1973   Japan..............................48-25452

[52] U.S. Cl. ................ 315/381; 315/106; 315/107; 317/9 R; 317/51
[51] Int. Cl.² ........................................ H01J 29/70
[58] Field of Search ........... 315/380, 381, 107, 106, 315/105, 175, 176; 317/9 R, 3, 4, 51, 262 PS

[56] References Cited
UNITED STATES PATENTS

| | | | |
|---|---|---|---|
| 1,698,625 | 1/1929 | Bubilier | 315/107 |
| 2,413,760 | 1/1947 | Graf | 315/107 |
| 2,509,277 | 5/1950 | Ransburg et al. | 317/262 PS |
| 2,828,446 | 3/1958 | Nissel et al. | 315/106 |
| 3,017,564 | 1/1962 | Barney | 315/107 |
| 3,407,330 | 10/1968 | Wilmarth | 315/381 |
| 3,496,352 | 2/1970 | Jugle | 250/326 |
| 3,588,508 | 6/1971 | Halinski | 315/380 |
| 3,668,465 | 6/1972 | Evans et al. | 315/107 |
| 3,697,800 | 10/1972 | McArdle | 315/380 |

OTHER PUBLICATIONS

A. A. Goldberg, "Picture Tube Emission Tester & Rejuvenator," Radio & Television News, Sept. 1952, pp. 39 & 98.

*Primary Examiner*—Maynard R. Wilbur
*Assistant Examiner*—G. E. Montone
*Attorney, Agent, or Firm*—Webb, Burden, Robinson & Webb

[57] ABSTRACT

An electron gun comprising a changeover chamber and changeover circuit between the gun chamber and the insulated cable which connects the power supply circuits to the electrodes which enables adjustment of electrode potentials to accomplish electrode treatment without excessive gun currents.

6 Claims, 3 Drawing Figures

PROTECTION CIRCUIT FOR ELECTRON GUN

This invention relates to an improvement for an electron gun in an electron beam apparatus.

Certain types of electron guns employed in electron microscopes and the like occasionally require special treatment prior to being operated. For example, with electron guns operating at very high accelerating voltages, it may be necessary to follow a procedure known as "conditioning" to increase the in-vacuo withstand voltage, viz., insulation, between the accelerating electrodes prior to generating an electron beam. Also, with field emission type electron guns, it may be necessary to clean the surface of the emitter by subjecting it to short periods of heat treatment known as "flushing".

In either the case of conditioning or flushing, it is necessary to changeover the wiring between the gun electrodes and their respective power circuits. In conventional apparatus, this changeover operation is carried out by mechanically changing the wiring in a power box located separately from gun chamber, a procedure which is not only troublesome but has the drawback of being prone to human error. Furthermore, if the insulated cable connecting the electron gun chambers to the power supply circuits is long and its stray capacity is large and the emitter is likely to be damaged when vacuum discharge occurs inside the electron gun chamber during the conditioning and flushing procedures.

The object of this invention is to eliminate the above drawbacks and thereby facilitate and enhance the reliability of conditioning and flushing by incorporating a novel device for switching the electric wiring between the gun electrodes and their respective power supply circuits which device is located between the gun chamber and the insulated cable which connects the power supply circuits to the electrodes.

Briefly, according to this invention, there is provided an electron gun for emitting an electron beam into an evacuated chamber having a power supply. The power supply is connected to the gun by a cable. Between the cable and the electron gun, adjacent the electron gun, there is provided a switching means. The switching means comprises a protection circuit comprising resistors, capacitors and automatic switches to prevent excess of currents from flowing through the electron gun during an unexpected disorder of the gun during normal operation. In preparation for a normal operation, the switching circuit may be used to adjust the electrode potential to accomplish an electrode treatment without causing excessive current. The placement of the switching circuit provides added protection for the electrodes because the capacity of the cable is eliminated as a factor.

Figure 3:
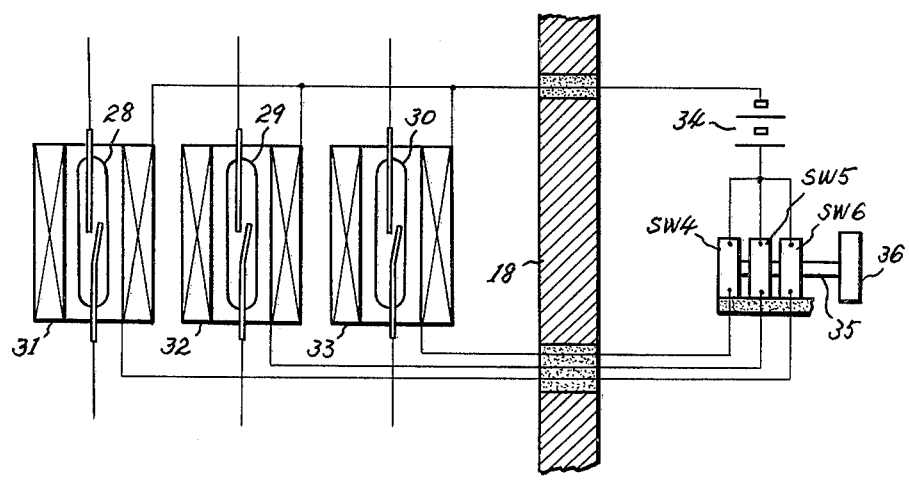
Figure 2:
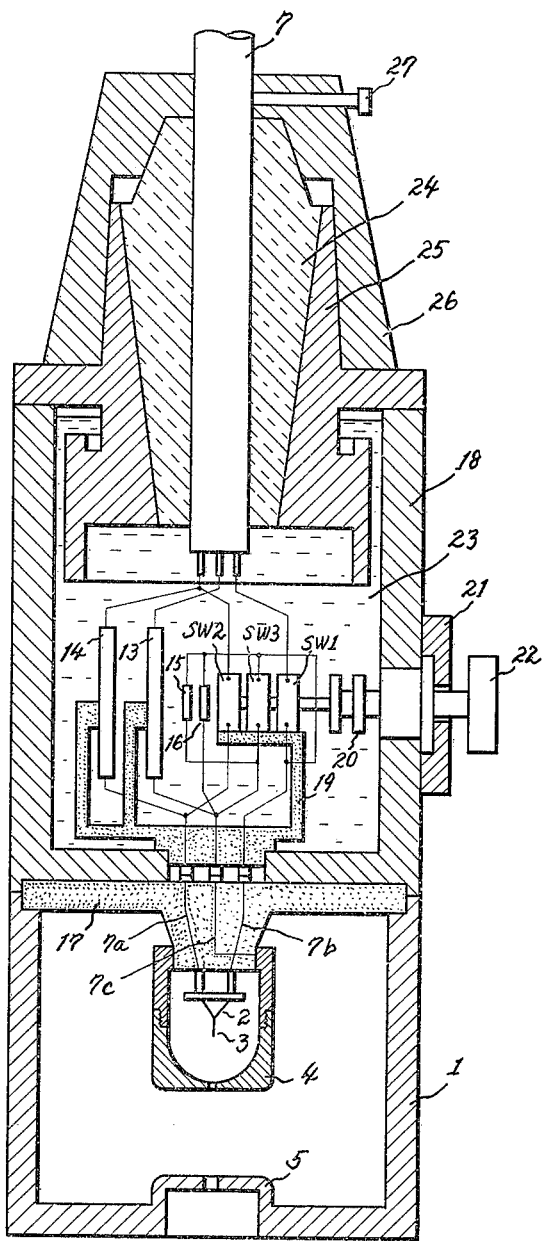

This invention will be more clearly understood by reading the following detailed description, in which the invention is described with reference to a field emission type electron gun illustrated in drawings of which:

FIG. 1 shows a field emission type electron gun capable of emitting an electric field in the cold state; and, FIGS. 2 and 3 show the mechanical structure adjacent to the wiring changeover chamber 12 shown in FIG. 1.

Referring to FIG. 1, an electron gun comprises a chamber 1 maintained in vacuo, a filament 2 for heating an emitter 3 attached to said filament 2, a first electrode 4 for generating a strong electric field at the emitter tip, a second electrode or anode 5 maintained at ground potential. The filament 2 and the first electrode 4 are connected to power box 6 by an insulated cable 7. A D.C. high voltage power source 8 supplies a high potential of 100KV to the emitter 3. A D.C. voltage power source 9 applies a potential difference in the order of several tens of KV between the emitter 3 and the first electrode 4 to cause field emission, and an A.C. power source 10 in circuit with an insulation transformer 11 supplies heating filament 2. Located between the insulated cable 7 and the electron gun chamber 1, is an electric wiring changeover chamber 12, which houses a bank of three changeover switches $SW_1$, $SW_2$, $SW_3$, discharge proof high order resistors 13 and 14, a condenser 15 and an arrester 16.

Since the high voltage for accelerating the field emitted electron beam is applied between electrodes 4 and 5, a vacuum insulated breakdown will occur if the vacuum pressure in the chamber should deteriorate for any reason. In event of such a breakdown, excess voltage will be generated between emitter 3 and the electrode 4, a phenomenon which gives rise to an arc discharge between said electrodes with resultant damage to the emitter tip. The high order resistors 13 and 14 serve to prevent the electric charge stored in the capacitance of the power sources housed in the power box 6 and the stray capacitance of the cable 7 from discharging as excess current in event of insulation breakdown due to vacuum deterioration, and the condenser 15 and the arrester 16 serve as a circuit breaker in event excess voltage is generated between the emitter 3 and the electrode 4.

If the changeover chamber 12 comprising high-order resistors is arranged in the power box 6, instead of between the cable 7 and the gun chamber 1, the electric charge stored in the stray capacitance of the cable 7 will generate an excess discharge current between the emitter and the first electrode directly and not through the high order resistors.

To perform the operation known as flushing (i.e. to clean the emitter by subjecting it to short periods of heat treatment as previously referred to) in the apparatus shown in FIG. 1, the switches $SW_1$, $SW_2$ and $SW_3$ are brought into a conducting condition and the emitter is heated by the A.C. power source 10 without using the resistor 13. In this state, it is necessary to reduce the output of the power source 9 to zero, with $SW_3$ closed, because an excess field emission is generated by the electric field between the heated emitter and the first electrode 3.

To perform the operation known as conditioning (i.e. to increase the in-vacuo withstand voltage between electrodes 4 and 5), only switch $SW_3$ is engaged and the output of the power source 9 is reduced to zero as in the case of flushing. In this case, the output of the high voltage power source 8 is increased by 5 ~ 30% over normal. As a result, ions are forcibly made to impinge on the electrode surfaces, thereby removing microprotuberances and dust. By so doing, the possibility of electric discharge is minimized.

Furthermore, by forcibly generating a micro discharge on the electrode surfaces, the electric charge which builds up on said surfaces is eliminated, thereby creating a situation whereby the occurrence of an electric charge, is highly unlikely with time.

For normal operation, switches $SW_1$, $SW_2$ and $SW_3$ are open and the output of the power source 9 is normalized; i.e. increased from zero to appropriated operating value.

FIG. 2 shows the mechanical structure adjacent to the wiring chamber 12 shown in FIG. 1. In the figure the upper cover 17 of an electron gun chamber is fabricated in ceramic or either suitable insulating material so as to provide physical support for the filament and emitter. The upper side of upper cover 17 is provided with three terminals to which are connected lead wires 7a and 7b for heating the emitter and lead wire 7c which supplies potential to electrode 4. Said three terminals are in turn connected to another set of terminals provided on an insulated supporting member 19 which is attached to the base of an insulated container 18 constituting the upper part of the electron gun. Resistors 13 and 14, changeover switches $SW_1$, $SW_2$ and $SW_3$, condenser 15 and arrester 16 etc. are supported in the insulated container 18 by the insulated supporting member 19. The changeover switches $SW_1$, $SW_2$ and $SW_3$ are connected to an insulated rod 20 which passes through a hole cut into the container wall and a member 21 so as to enable said rod to be externally controlled. The rod assembly is supported and secured by manipulating a knob 22 attached to the end of said rod. The insulated container 18 is filled with insulating oil 23 and the top of the container is sealed by an insulated supporting member 24 which supports cable 7 and a second supporting member 25 which supports the supporting member 24. The cable 7 which connects the electron gun and high voltage power circuits is held fixedly in a holder 26 by a clamping screw 27.

The switches $SW_1$, $SW_2$ and $SW_3$ are engaged or disengaged by rotating the rod 20. However, the amount of rotation required to engage or disengage the switches varies from switch to switch. That is to say, there are three switch combinations according to a given amount of rotation and each combination sets the precise condition for "normal operation", "conditioning" or "flushing" respectively. Thus, in the arrangement as embodied in this invention, it is possible to make the necessary wiring changeovers between the respective power circuits and the gun electrodes safely and surely simply by manipulating a knob located conveniently near the gun chamber.

FIG. 3 shows an essential part of another changeover chamber according to this invention. In this embodiment, reed switches 28, 29, 30 are incorporated instead of the mechanical changeover switches $SW_1$, $SW_2$ and $SW_3$. The said reed switches 28, 29 and 30 are changed over by magnetic field generated by magnetic coils 31, 32 and 33. These coils are excited by the output current of a D.C. voltage supply source 34 spaced from the changeover chamber. The excitation currents are controlled out from the wall of container 18 by mechanical changeover switches $SW_4$, $SW_5$ and $SW_6$ which are connected to an insulation rod 35. By rotating a knob 36 attached to the end of the rod 35, the switches $SW_4$, $SW_5$ and $SW_6$ are changed over as same as the switches $SW_1$, $SW_2$ and $SW_3$ shown in FIG. 2.

The above described invention is not limited to the above described embodiment. It is also applicatory to various types of electron guns. For example, it can be incorporated into hot filament type field emission guns or conventional thermionic emission type guns in which case flushing is unnecessary thereby reducing the changeover sequence to two switch combinations instead of three. Again, if a thermionic irradiating means is provided to clean the anode or the first electrode, the necessary changeover means for this capability can be easily added.

Having thus described the invention with the detail and the particularity as required by the Patent Laws, what is desired protected by Letters Patent is set forth in the following claims.

We claim:

1. A field emission type electron gun comprising an electron gun chamber (1) containing a filament (2) for supporting and heating an emitter (3), a first electrode (4) for generating a strong electric field at the emitter tip, and a grounded anode (5), a power unit (6) containing a d.c. high voltage power source (8) for maintaining the filament (2) and first electrode (4) at negative high potential, and a power source (10) for supplying heating current to said filament (2), an insulating cable (7) for connecting the power unit (6) and the electron gun chamber (1) via an electric wiring changeover chamber (12) located between said insulating cable (7) and said electron gun chamber (1), said chamber (12) containing high order resistors (13 and 14) located in the d.c. high voltage power source (8) and first electrode (4) line circuit and the power source (10) and filament (2) line circuit respectively, for preventing the electric charge stored in the stray capacity of the insulated cable (7) and in the capacitance of power sources (8 and 10) from discharging an excess current, within said changeover chamber (12) a changeover means (SW3) being connected between the emitter (2) and the first electrode (4) in order to provide a normal operating mode when open and a conditioning operating mode for increasing the in-vacuo withstand voltage in the gun chamber when closed.

2. A field emission type electron gun as described in claim 1 in which said changeover means comprises a magnetically activated reed switch.

3. A field emission type electron gun as described in claim 1 in which said changeover means comprises a mechanical switch.

4. A field emission type electron gun comprising an electron gun chamber (1) containing a filament (2) for supporting and heating an emitter (3), a first electrode (4) for generating a strong electric field at the emitter tip, and a grounded anode (5), a power unit (6) containing a d.c. high voltage power source (8) for maintaining said filament (2) and first electrode (4) at negative high potential, and a power source (10) for supplying heating current to the filament (2), an insulating cable (7) for connecting the power unit (6) and the electron gun chamber (1) via an electric wiring changeover chamber (12) located between said insulating cable (7) and said electron gun chamber (1), said chamber (12) containing high order resistors (13 and 14) located in the d.c. high voltage power source (8) and first electrode (4) line circuit and the power source (10) and filament (2) line circuit respectively, for preventing the electric charge stored in the stray capacity of the insulated cable (7) and in the capacitance of power sources (8 and 10) from discharging as excess current, within said changeover chamber (12) first and second changeover means (SW1 and SW2) being connected in series in a filament heating circuit and with third changeover means (SW3) being connected between the emitter (2) and the first electrode (4) in order to provide a normal operating mode when all changeover means are open and a flushing operating mode for superheating and thereby decontaminating the emitter surface when all changeover means are closed and a conditioning mode when the first and second changeover means are open and the third changeover means is closed.

5. A field emission type electron gun as described in claim 4 in which said changeover means comprise magnetically activated reed switches.

6. A field emission type electron gun as described in claim 4 in which said changeover means comprise mechanical switches.

* * * * *